United States Patent

Merchant et al.

Patent Number: 6,071,808
Date of Patent: Jun. 6, 2000

[54] METHOD OF PASSIVATING COPPER INTERCONNECTS IN A SEMICONDUCTOR

[75] Inventors: Sailesh M. Merchant; Sudhanshu Misra; Pradip K. Roy, all of Orlando, Fla.

[73] Assignee: Lucent Technologies Inc., Murray Hill, N.J.

[21] Appl. No.: 09/339,085

[22] Filed: Jun. 23, 1999

[51] Int. Cl.[7] .............................................. H01L 21/4763
[52] U.S. Cl. ........................ 438/633; 438/687; 438/624; 438/672
[58] Field of Search .................. 438/687, 624, 438/633, 672

[56] References Cited

U.S. PATENT DOCUMENTS

| | | | |
|---|---|---|---|
| 4,789,648 | 12/1988 | Chow et al. | 437/225 |
| 5,271,797 | 12/1993 | Kamisawa | 156/635 |
| 5,595,937 | 1/1997 | Mikagi | 437/192 |
| 5,731,245 | 3/1998 | Joshi et al. | 438/705 |
| 5,736,457 | 4/1998 | Zhao | 438/624 |
| 5,773,364 | 6/1998 | Farkas et al. | 438/692 |
| 5,801,094 | 9/1998 | Yew et al. | 438/624 |
| 5,840,629 | 11/1998 | Carpio | 438/692 |
| 6,001,730 | 12/1999 | Farkas et al. | 438/627 |
| 6,008,114 | 12/1999 | Li | 438/618 |
| 6,010,962 | 1/2000 | Liu et al. | 438/687 |

*Primary Examiner*—Matthew Smith
*Assistant Examiner*—Renzo N Rocchegiani
*Attorney, Agent, or Firm*—Allen, Dyer, Doppelt, Milbrath & Gilchrist, P.A. Attorneys at Law

[57] ABSTRACT

A method of passivating copper interconnects is disclosed. A freshly electrodeposited copper interconnect such as formed as via/trench structures in semiconductor manufacturing is chemically converted to passivating surface of copper tungstate or copper chromate either through MOCVD reaction with vapors of tungsten or chromium alkoxides, or by pyrolytic reaction with tungsten or chromium carbonyl in the presence of $O_2$. The copper interconnect having the formed passivation service is then chemically mechanically polished. The process can be used with various manufacturing processes, including single and dual damascene processes.

20 Claims, 5 Drawing Sheets

METHOD OF PASSIVATING COPPER INTERCONNECTS IN A SEMICONDUCTOR

FIELD OF THE INVENTION

This invention relates to the field of semiconductor manufacturing, and more particularly, this invention relates to the field of semiconductor manufacturing having copper interconnects that are passivated.

BACKGROUND OF THE INVENTION

In the manufacture of semiconductor wafers and integrated circuits, interconnects, such as vias and trenches, are formed by various techniques, including single and dual damascene processes. Additionally, metal films are deposited on semiconductor substrates, oxides and other dielectrics. Sometimes metal films are used for forming interconnect lines, metallic contacts, conductive vias, metallic interconnects and other conductive features on and above various surfaces of the semiconductor wafers. Typically, the films can be chemically mechanically polished to form the desired interconnect posts and interconnect structures formed from via/trenches.

Typically, aluminum has been a preferred conductive metal because it avoids various problems, such as a high contact resistance with silicon, which normally accompanies the use of gold and copper. Copper also suffers drawbacks compared to aluminum because copper migrates in the device areas, causing problems in device performance. Aluminum, on the other hand, has good adhesion to silicon dioxide and performs well with plasma etching, as compared to copper, which does not perform adequately with plasma etching processes.

Recently, greater interest has been shown by manufacturers of semiconductor devices and the use of copper and copper alloys for metallization patterns, such as in conductive vias and patterns (e.g., trench structures). Copper has a lower resistivity than aluminum. Unfortunately, the standard processes used for pattern definition with semiconductors have not been adequately used with copper integrated circuit metallization, and especially with copper interconnects. These processes include conventional dry etched techniques and selective deposition techniques. However, chemical mechanical polishing (CMP) techniques have been found useful in patterning copper layers. Even with the more efficient chemical mechanical polishing techniques, it is still necessary to passivate copper interconnects such as in via/trench structures, and such as copper plugs used in copper interconnects. Copper has the tendency to corrode, and thus, passivation is necessary.

SUMMARY OF THE INVENTION

It is therefore an object of the present invention to provide a method of passivating copper interconnects in a semiconductor that overcomes disadvantages of the prior art.

The method of the present invention now provides a method of passivating copper interconnects. The method comprises the steps of exposing a freshly electrodeposited copper interconnect, such as a via/trench structure, to alkoxide vapor of either tungsten or chromium at elevated temperature (200° C. to 750° C.) to form copper tungstate and copper chromate as a passivating surface on the exposed copper interconnect. The chemistry involved in this conversion is that of an organo-metallic chemical vapor deposition (MOCVD) reaction, typically well known to those skilled in the art. The alkoxides used could be of the type $W=O\,(OR)_4$ and $Cr\,(OR)_3$, where R is an organic radical typically alkyl.

An alternative method for passivating copper films is through a pyrolytic heat treatment of copper films with carbonyl of tungsten and chromium in excess of oxygen. The reaction product is a surface passivating layer of copper tungstate and copper chromate.

The method includes the step of chemically mechanically polishing the copper interconnects having the formed passivation service. Conventional tungsten copper mechanical polishing can be used.

In still another aspect of the present invention, an oxide layer can be deposited over a semiconductor substrate and in-laid patterns can be etched within the oxide layer. A copper layer can be electrodeposited within at least the in-laid pattern to form copper interconnects. These freshly electrodeposited copper interconnects can be chemically converted tungstates or chromates of copper through a thermally activated MOCVD reaction with alkoxide precursors of tungsten and chromium respectively. These tungstates and chromates of copper aid in passivating the exposed copper interconnects.

In the alternate methodology of using carbonyls of tungsten and chromium for pyrolytic reaction with copper, an in-situ oxide of tungsten and chromium is formed that readily reacts with copper forming copper tungstate and copper chromate respectively. Ultimately, a similar passivation layer is obtained by the use of carbon compared to that using alkoxide MOCVD. Those copper interconnects having the passivation surface can be chemically mechanically polished.

In accordance with the present invention, the method of passivating copper interconnects can also be used when a single or dual damascene manufacturing process is used, such as when an etch stop layer is formed over an oxide layer and then a second oxide layer formed over the etch stop layer. Trench openings can be formed within the second oxide layer and etching can occur through the etch stop layer. The second set of openings in the first oxide layer can be defined by the first set of openings to form vias for interconnects. A copper layer can be electrodeposited over selected portions of the second oxide layer such that copper is deposited within the first and second set of openings and forms exposed copper interconnects. Naturally, the copper layer can be formed over a greater part of the surface and chemical mechanical polishing can expose the copper interconnects for the via/trench structures, as is well known to those skilled in the art. The copper interconnects can be made to undergo chemical reaction with tungsten or chromium alkoxides using MOCVD process, or a pyrolytic reaction with tungsten or chromium carbonyls to form copper tungstates or copper chromate as a passivating surface on the exposed interconnects. Copper interconnects having the passivation service can be chemically mechanically polished.

BRIEF DESCRIPTION OF THE DRAWINGS

Other objects, features and advantages of the present invention will become apparent from the detailed description of the invention which follows, when considered in light of the accompanying drawings in which.

DETAILED DESCRIPTION OF THE PREFERRED EMBODIMENTS

The present invention is advantageous because it allows the freshly electrodeposited copper via/trench structures to be exposed in a MOCVD reactor containing alkoxide of tungsten or chromium to chemically form copper tungstates and copper chromates to passivate the copper surface. The method of the present invention can be used with single and dual damascene processes. Freshly electrodeposited copper interconnects can be exposed in a wet bath containing one of at least one tungsten oxide and chromium oxide to form respectively one of at least copper tungstates and copper chromates as a passivating surface on the exposed copper interconnects. The copper interconnects having the passivation surface can then be chemically mechanically polished. It is also possible to use the wet bath when the copper layer extends over surface areas adjacent the posts and structures formed by the via/trenches, such as in some damascene and other semiconductor manufacturing methods.

Figure 1:
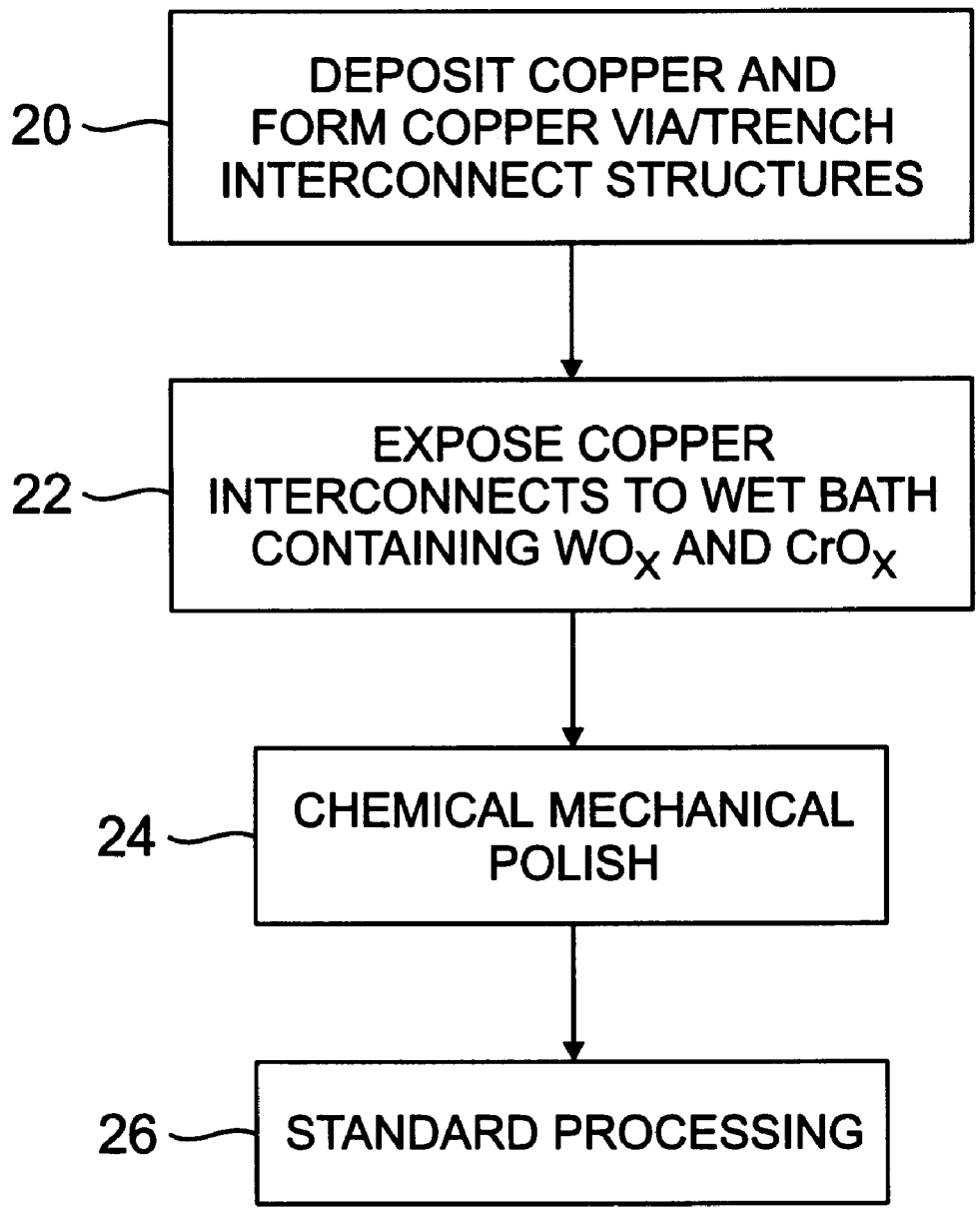
FIG. 1 is a flow chart showing the basic steps of the method of the present invention.

FIG. 1 illustrates a basic flow chart showing elementary steps of the method of the present invention. Copper is first deposited to form the via/trench structures (Block 20). The semiconductor wafer is then inserted within a wet bath containing one of at least tungsten oxide and chromium oxide to form respectively one of at least copper tungstates and copper chromates as a passivating surface on the exposed copper interconnects (Block 22).

The copper interconnects having the passivating surface are then subjected to chemical mechanical polishing (Block 24). After the chemical mechanical polishing, the wafer is then subjected to standard processes (Block 26).

Figure 2:
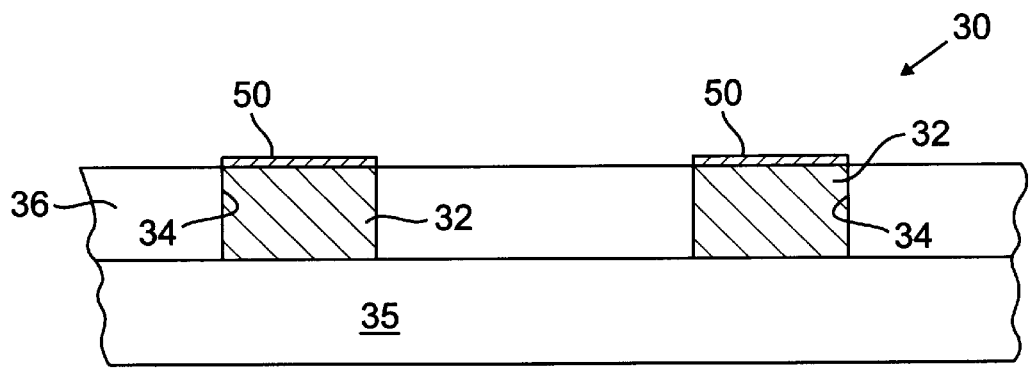
FIG. 2 is a schematic drawing of a semiconductor wafer showing two copper trenches that will be passivated by the method of the present invention.

FIG. 2 illustrates a semiconductor wafer 30 having two interconnect structures 32, such as formed by trenches 34, which could be formed by a damascene process as known to those skilled in the art. A semiconductor substrate 35 includes a first oxide layer 36 and the trenches 34 that are copper filled to form the interconnect 32.

Figure 3:
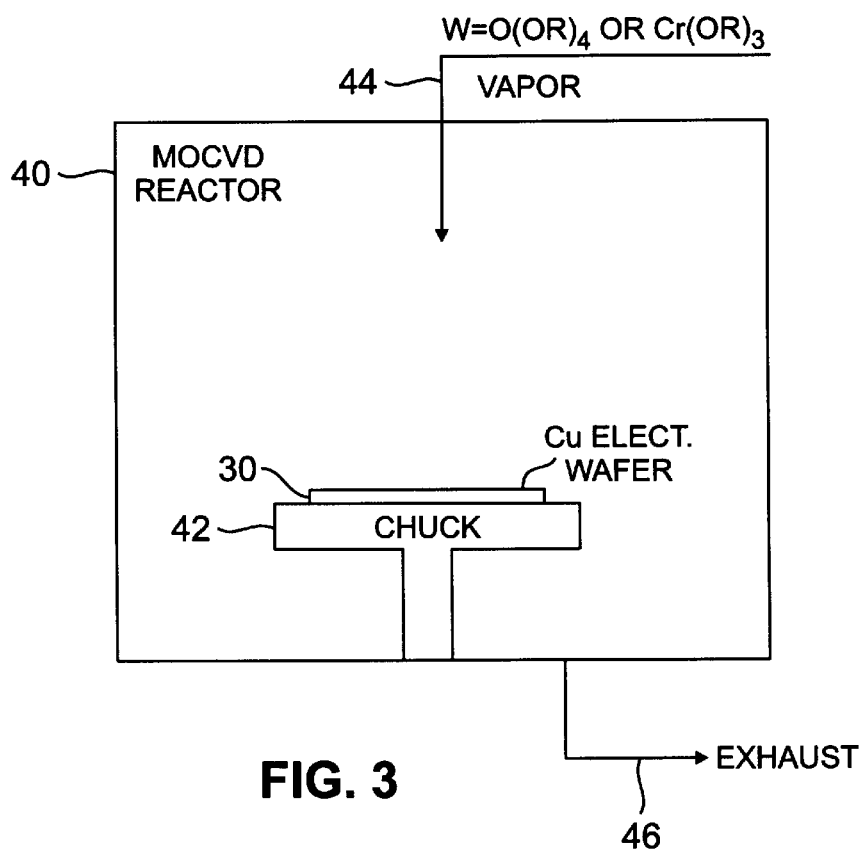
FIG. 3 shows a MOCVD reactor that is used for passivating copper interconnects of the present invention.
Figure 4:
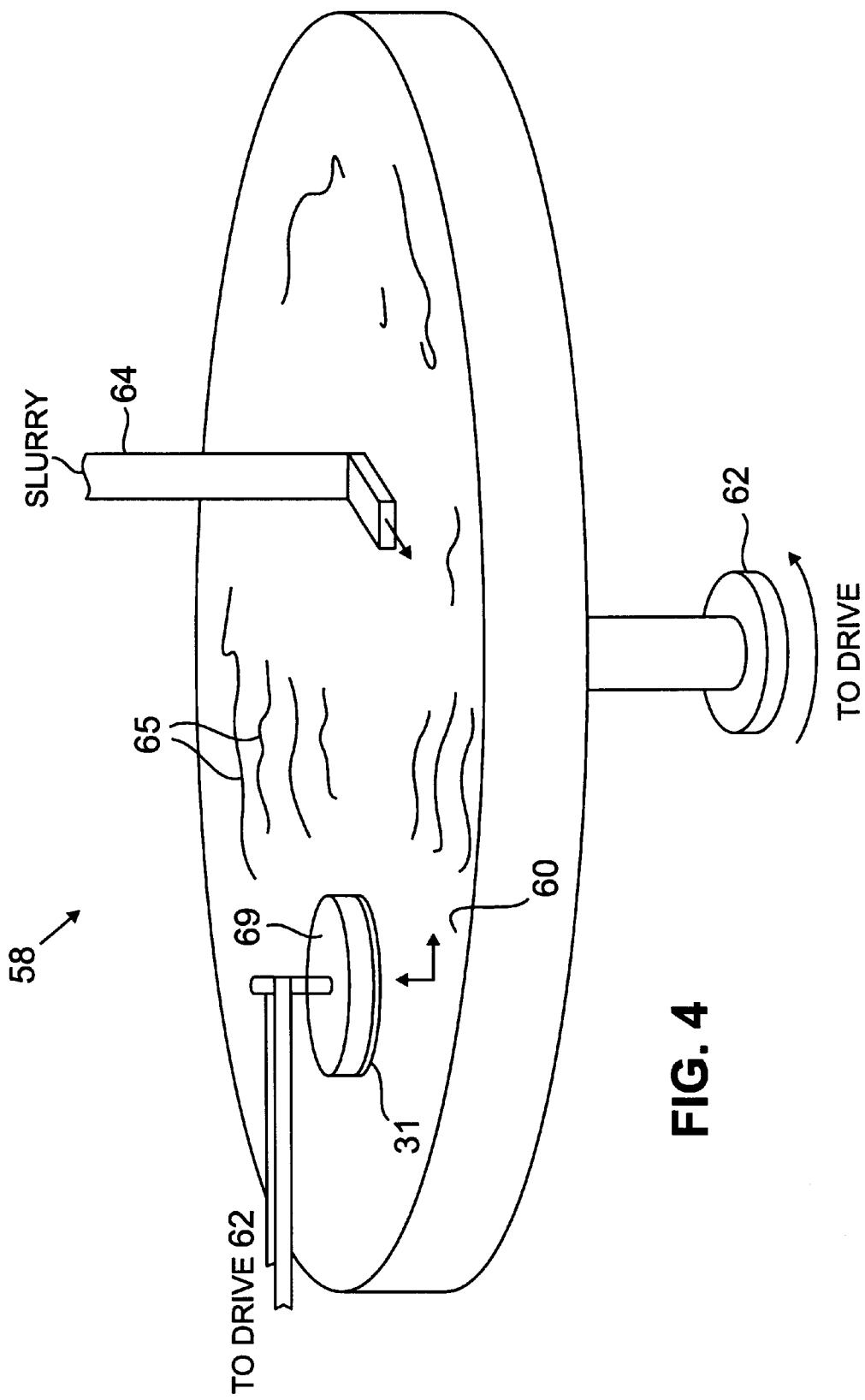
FIG. 4 is a schematic, isometric view of a chemical mechanical polishing step in accordance with the present invention.
Figure 5:
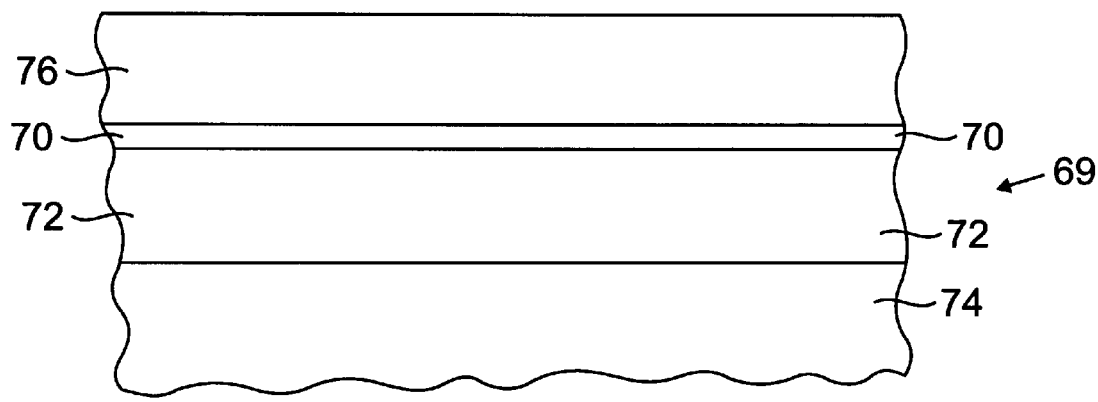
FIGS. 5–8 illustrate a damascene process that can be used in the present invention for passivating copper interconnects.

FIG. 3 illustrates an MOCVD reactor 40 having the copper electrodeposited wafer 30 positioned on a chuck 42 as is known to those skilled in the art. In accordance with the present invention, the vapor 44 is inserted into the reactor at the top and the exhaust 46 is removed from the lower portion. In accordance with the present invention, the freshly electrodeposited copper interconnects are exposed to alkoxide vapor of either tungsten or chromium and elevated temperature (200° C. to 750° C.) to form copper tungstate and copper chromate as a passivating surface on the copper interconnect. The chemistry involved in this conversion is that of an organo-metallic chemical vapor deposition (MOCVD) reaction, typically well known to those skilled in the art. The alkoxides used could be of the type W=O (OR)$_4$ and Cr (OR)$_3$, where R is an organic radical, typically an alkyl.

An alternative method for passivating copper films is through a pyrolytic heat treatment of copper films with carbonyl of tungsten and chromium in excess of oxygen. The reaction product is a surface passivating layer of copper tungstate and copper chromate. The pyrolytic chemical conversion can be conducted at high temperature ranging from 200° C. to 110° C. using tungsten carbonyl in the presence of excess $O_2$ to facilitate the passivation reaction for copper tungstate formation. The MOCVD reaction can also involve an MOCVD reaction with chromium alkoxide at 200° C. to 750° C. temperature.

The chemical conversion results in a passivation layer 50 on the interconnects (FIG. 1). After the formation of the passivation layer 50 on the interconnects, the semiconductor wafer 30 is then passed to a mechanical tool 58 for performing chemical mechanical polishing on the wafer. The wafer is carried by a wafer carrier 59 and placed face-down on a polishing pad 60 so that the wafer surface to be polished rests against the surface of the polishing pad 60. Various drive mechanisms 62 provide the rotation and movement of a wafer relative to the polishing pad 60. The polishing pad can rotate in operation. The process can be a conventional tungsten CMP process as known to those skilled in the art.

A slurry delivery system 64 allows a slurry 65 to flow over the surface of the polishing pad 60 during the chemical mechanical polishing operation. The slurry contains many of the components known to those skilled in the art, including an abrasive, inorganic material, such as silicon dioxide, and other compound elements known to those skilled in the art. It can include surfactants to activate the surface, and corrosion inhibitors, such as BTA, often used for copper. It is possible the slurry can also contain a nitric acid (HNO3) when any passivating film is formed from a chromite. The slurry could contain an ammonium hydroxide (NH4OH) when any passivating film is formed from a chromate. The slurry can contain additives and have a pH range that makes the slurry applicable for tungsten chemical mechanical polishing.

Figure 6:
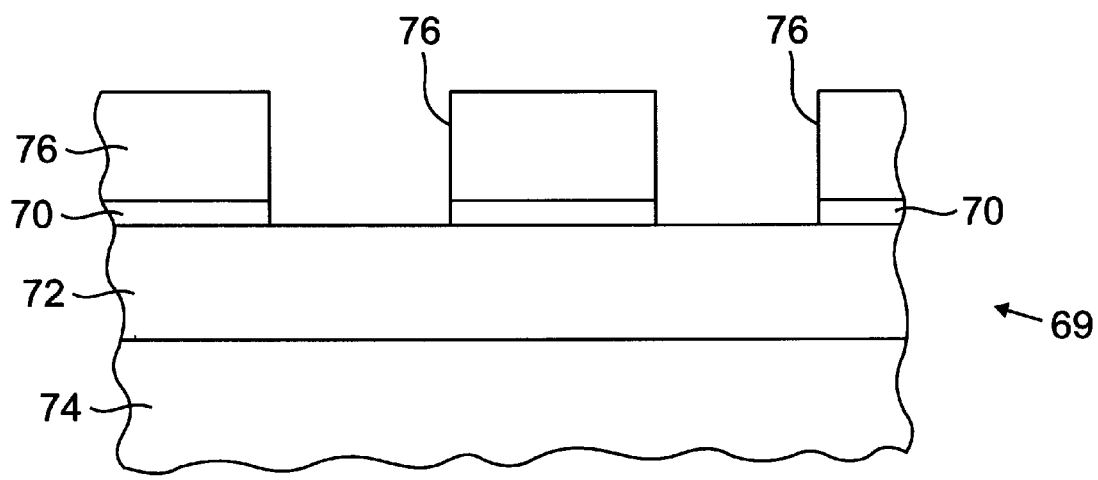
Figure 7:
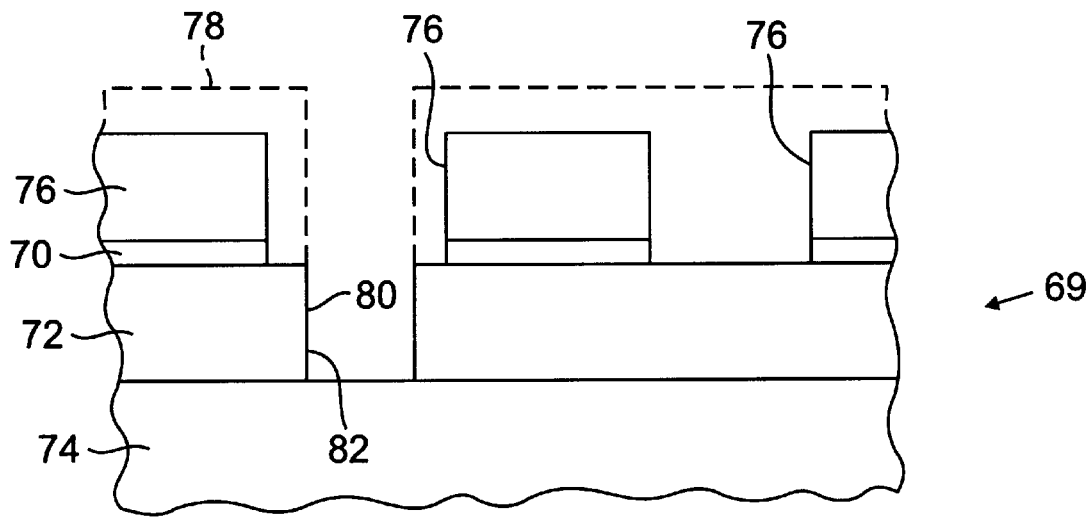
Figure 8:
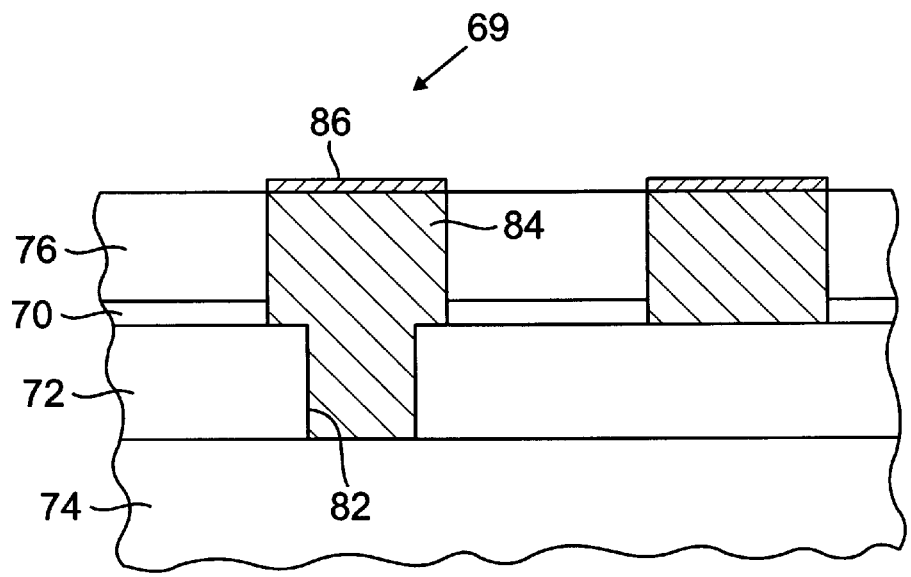

FIGS. 5–8 illustrate another damascene process applicable with the present invention where a wafer 69 where an etch stop layer 70 is applied over the first oxide layer 72 that covers a semiconductor substrate 74. A second oxide layer 76 is formed over the etch stop layer 70. The etch stop layer 70 can be formed from silicon nitride as known to those skilled in the art. Trenches 76 can be formed as openings in the first oxide layer 76 and then into the etch stop layer 70 using the standard photoresist and other techniques known to those skilled in the art (FIG. 6). A new photoresist 78 can then be placed over the wafer and a second opening 80 forming a via 82 can be formed in the second oxide layer to interconnect to the devices that could be formed on the semiconductor substrate 74 that may have formed semiconductor devices. Copper is deposited to form the interconnects 84 as shown in FIG. 8 and the structure subjected to the chemical conversion reaction as described above, forming the passivation layer 86 on the interconnects.

In accordance with the present invention, as known to those skilled in the art, it is possible to use the damascene process to form a copper layer over the entire surface of the second oxide surface 76, which is then chemically mechanically polished to form the interconnects 84 as shown in FIG. 8. Further details of the formation of a passivation layer over a copper layer are disclosed in commonly assigned U.S. patent application entitled, "METHOD OF MAKING A SEMICONDUCTOR WITH COPPER PASSIVATING FILM," filed on the same date as the present application by the present inventors, which discloses a method of making a semiconductor with a copper passivating film, the disclosure which is hereby incorporated by reference in its entirety. As set forth in that patent application, a passivating film could be formed on top of a deposited copper layer by depositing one of either a chromate or chromite on the deposited copper layer and forming a respective copper chromate or copper chromite composition. The passivating layer deposition could be formed by passing the wafer through an MOCVD reactor and depositing the chromite or chromate onto the deposited copper layer. It is also possible to use other techniques, even a pyrolytic reaction with chromium carbonyl. In limited supply of $O_2$, chromite will be formed. In excess $O_2$, chromate will be formed. The semiconductor wafer is then passed to the chemical mechanical polishing step where the slurry contains a nitric acid (HNO3) when the passivating film is formed from a chromite and ammonium hydroxide (NH4OH) when the passivating film is formed from the chromate. The polishing step reduces the copper layer to form the interconnects.

Many modifications and other embodiments of the invention will come to the mind of one skilled in the art having the benefit of the teachings presented in the foregoing descriptions and the associated drawings. Therefore, it is to be understood that the invention is not to be limited to the specific embodiments disclosed, and that the modifications and embodiments are intended to be included within the scope of the dependent claims.

What is claimed is:

1. A method of passivating copper interconnects in a semiconductor comprising the steps of:

depositing a first oxide layer over a semiconductor substrate;

forming an etch stop layer over the oxide layer;

forming a second oxide layer over the etch stop layer;

etching a first set of trench openings within the second oxide layer and then etching through the etch stop layer;

etching a second set of openings in the first oxide layer within the bounds defined by the first set of openings to form vias for interconnects;

electrodepositing a copper layer over selected portions of the second oxide layer such that copper is deposited within the first and second sets of openings and forming exposed copper interconnects;

exposing the electrodeposited copper interconnects to a chemical reaction containing vapors of tungsten alkoxide and chromium alkoxide in an MOCVD reactor to form respectively copper tungstates and copper chromates as a passivating surface on the exposed copper interconnects; and then chemically mechanically polishing the copper interconnects having the passivating surface.

2. A method according to claim 1, and further comprising the step of chemically mechanically polishing with a tungsten chemical mechanical polishing process.

3. A method according to claim 1, and wherein the method further comprises an MOCVD reaction between copper and tungsten or chromium alkoxide.

4. A method according to claim 3, and wherein said chromium alkoxide precursor is used and the MOCVD reaction is done at elevated temperature ranging from 200° C. to 750° C. to facilitate passivation reaction.

5. A method according to claim 1, and further comprising the step of initiating a pyrolytic chemical reaction, wherein said pyrolytic chemical reaction comprises pyrolytic breakdown of tungsten and chromium carbonyls forming copper tungstates and chromates upon reaction with copper.

6. A method according to claim 5, wherein said pyrolytic chemical conversion is conducted at high temperatures ranging from 200° C. to 1100° C. and the use of chromium carbonyl in the presence of excess $O_2$ to facilitate passivation reaction.

7. A method according to claim 1, and further comprising the step of forming the etch stop layer as a silicon nitride layer.

8. A method according to claim 1, and further comprising the step of depositing the copper layer by one of electrodeposition, electroplating or chemical vapor deposition.

9. A method of passivating copper interconnects in a semiconductor comprising the steps of:

depositing an oxide layer over a semiconductor substrate;

etching an in-laid pattern within the oxide layer;

electrodepositing a copper layer within at least the in-laid pattern to form copper interconnects;

exposing the electrodeposited copper interconnects to an alkoxide vapor or carbonyl vapor of tungsten or chromium in an MOCVD reactor as an MOCVD reaction to form respectively one of at least copper tungstates and copper chromates as a passivating surface on the exposed copper interconnects; and then chemically mechanically polishing the copper interconnects having the passivation surface.

10. A method according to claim 9, and further comprising the step of chemically mechanically polishing with a tungsten chemical mechanical polishing process.

11. A method according to claim 9, and wherein said tungsten alkoxide precursor is used and the MOCVD reaction is conducted at an elevated temperature ranging from 200° C. to 750° C. to facilitate the passivation reaction for copper tungstate formation.

12. A method according to claim 9, wherein a pyrolytic chemical conversion is conducted at elevated temperatures ranging from 200° C. to 1100° C. using tungsten carbonyl in the presence of excess $O_2$ to facilitate the passivation reaction for copper tungstate formation.

13. A method according to claim 9, and further comprising the step of forming an etch stop layer as a silicon nitride layer.

14. A method according to claim 9, and further comprising the step of depositing the copper layer by one of electrodeposition, electroplating or chemical vapor deposition.

15. A method of passivating copper interconnects comprising the steps of:

exposing a freshly electrodeposited copper interconnect to a chemical reaction involving vapor phase alkoxides or carbonyls on tungsten and chromium to form respectively copper tungstates and copper chromates as a passivating surface on the exposed copper interconnect; and then chemically mechanically polishing the copper interconnects having the passivation surface.

16. A method according to claim 15, and further comprising the step of chemically mechanically polishing with a tungsten chemical mechanical polishing process.

17. A method according to claim 15, and further comprising an MOCVD reaction that involves MOCVD reaction with tungsten alkoxide at temperature ranges of 200° C. to 750° C.

18. A method according to claim 15, and further comprising a pyrolytic reaction that involves chemical conversion in the presence of $O_2$ using tungsten carbonyl at temperature ranges of 200° C. to 1100° C.

19. A method according to claim 15, and further comprising an MOCVD reaction that involves MOCVD reaction with chromium alkoxide at temperature ranges of 200° C. to 750° C.

20. A method according to claim 19, and further comprising a pyrolytic reaction that involves chemical conversion in the presence of chromium carbonyl and excess of $O_2$ at temperature ranges of 200° C. to 1100° C.

* * * * *